United States Patent [19]

Clendening

[11] 4,348,640
[45] Sep. 7, 1982

[54] DIVIDE BY THREE CLOCK DIVIDER WITH SYMMERTICAL OUTPUT

[75] Inventor: Steven J. Clendening, Plano, Tex.

[73] Assignee: Rockwell International Corporation, El Segundo, Calif.

[21] Appl. No.: 190,682

[22] Filed: Sep. 25, 1980

[51] Int. Cl.³ ............................................ H03K 21/00
[52] U.S. Cl. .................................. 328/41; 307/225 R
[58] Field of Search ............... 328/39, 41; 307/225 R, 307/445

[56] References Cited

U.S. PATENT DOCUMENTS

| | | | |
|---|---|---|---|
| 3,439,278 | 4/1969 | Farrow | 328/41 |
| 3,473,129 | 10/1969 | Tschannen | 328/39 |
| 3,571,728 | 3/1971 | Andrea et al. | 328/41 |
| 3,902,125 | 8/1975 | Oliva | 328/39 |
| 3,943,379 | 3/1976 | McGuffin | 307/225 R |
| 4,041,403 | 8/1977 | Chiapparoli | 328/39 |

Primary Examiner—John S. Heyman
Attorney, Agent, or Firm—Michael E. Taken; Howard R. Greenberg; H. Fredrick Hamann

[57] ABSTRACT

A digital circuit receives symmetrical clock pulses of frequency F and outputs symmetrical pulses of frequency ⅓ F. A divide by one and one-half circuit clocks a divide by two flip-flop resulting in a symmetrical divide by three output. The divide by one and one-half circuit includes a pair of JK flip-flops and logic gates which receive clock pulses of frequency F and generate a plurality of staggered signal streams with nonsymmetrical pulses of frequency ⅓ F and a duty cycle of substantially 33%. The input clock pulses are gated against two of these streams to provide an output pulse during the first half of the duty portion of a cycle of one of the streams, and another output pulse during the second half of the duty portion of a cycle of the other stream, to provide an output frequency of ⅔ F which then clocks the divide by two flip-flop.

8 Claims, 3 Drawing Figures

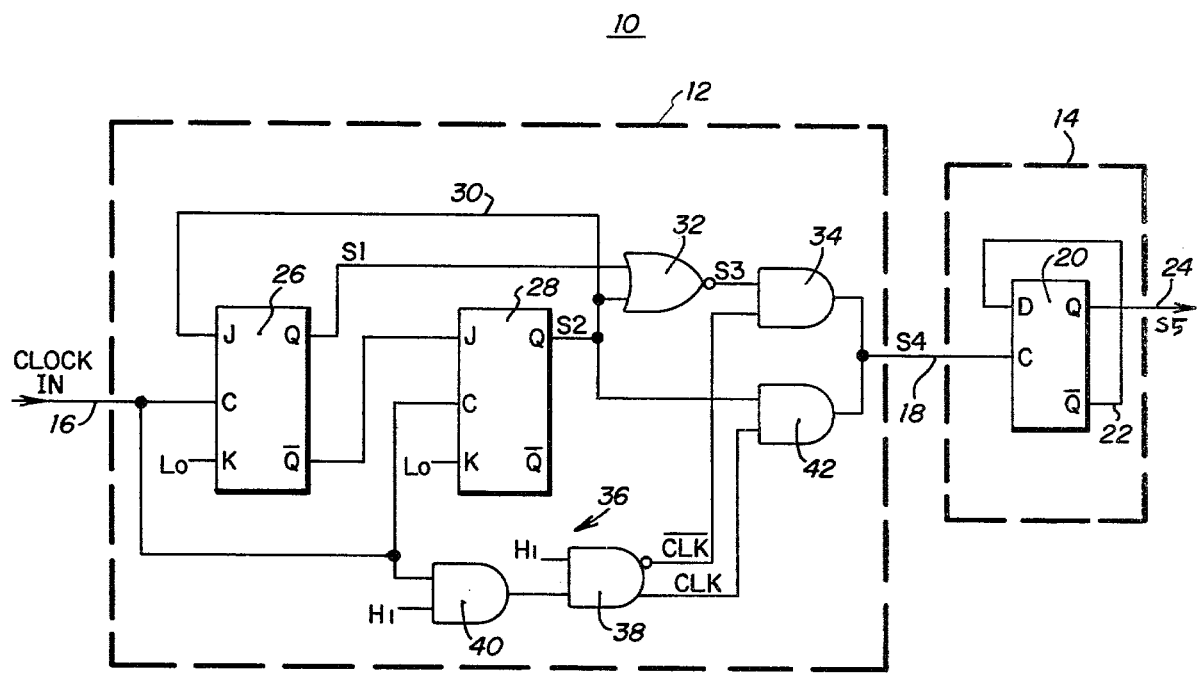
FIG. 1
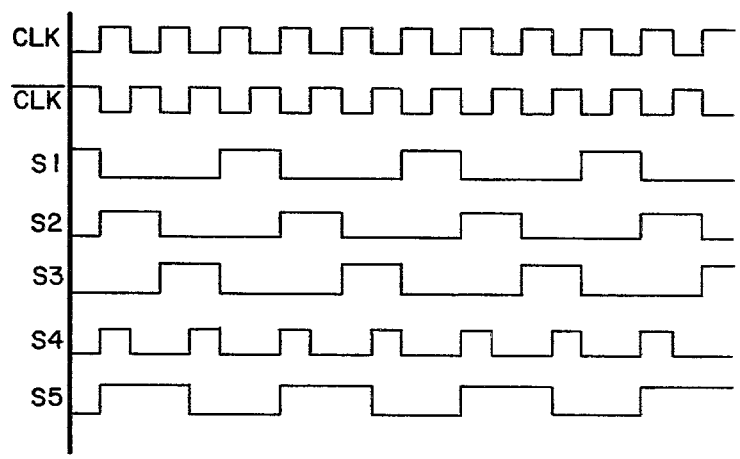
FIG. 3
FIG. 2

DIVIDE BY THREE CLOCK DIVIDER WITH SYMMERTICAL OUTPUT

TECHNICAL FIELD

The invention relates to digital clock dividers.

BACKGROUND

The present invention arose in conjunction with the development of a multiplexer wherein three digital streams were multiplexed together onto a single high speed line. At the demultiplexed end, a synchronous one-third rate clock was needed to demultiplex the high speed data into three streams at one-third the high speed rate. The high speed clock was symmetric, and the divide by three divider circuit also had to have a symmetric output. That is, the output had to have a 50% duty cycle, with the output clock signal having a high state 50% of the time, and a low state the remaining 50% of the time.

Divide by three digital clock dividers are known, but do not have a symmetric output. One alternative is to generate a signal of twice the clock rate frequency and then perform a divide by six operation. This alternative is objectionable however because it requires too much hardware and logic operation, particularly at the higher, doubled rate. Another alternative is the use of a phase locked loop operating at one-third the fundamental frequency of the clock. This is basically an analog technique, however, and would require a large amount of hardware.

SUMMARY

The present invention provides an all digital clock divider circuit which receives clock pulses of frequency F, divides by three, and outputs symmetrical pulses of frequency $\frac{1}{3}$F. A divide by one and one-half circuit clocks a divide by two flip-flop resulting in a symmetrical divide by three output.

The divide by one and one-half circuit receives clock pulses of frequency F and generates a plurality of staggered nonsymmetrical pulses of frequency $\frac{1}{3}$F, each having a duty cycle of 33%. The clock pulses are gated against two of the staggered pulse streams to provide a pulse stream with frequency $\frac{2}{3}$F. This pulse stream clocks a divide by two flip-flop which outputs symmetrical pulses of frequency $\frac{1}{3}$F.

BRIEF DESCRIPTION OF THE DRAWINGS

FIG. 1 is a circuit diagram of a divider circuit constructed in accordance with the invention.

FIG. 2 is a truth table for a JK flip-flop.

FIG. 3 is a timing diagram illustrating operation of the circuit of FIG. 1.

DETAILED DESCRIPTION

FIG. 1 shows a divide by three digital clock divider circuit 10 providing a symmetrical output. Circuit 10 includes a divide by one and one-half circuit 12, and divide by two means 14. Circuit 12 receives symmetrical input clock pulses of frequency F at input 16 and reduces or divides the rate thereof by one and one-half to yield a pulse stream of frequency $\frac{2}{3}$F at output 18. Divide by two means 14 is preferably a type D flip-flop 20 clocked by the signal on line 18, with its $\overline{Q}$ output fed back on line 22 to its D input. The Q output on line 24 provides symmetrical pulses of frequency $\frac{1}{3}$F.

Divide by one and one-half circuit 12 includes a pair of JK flip-flops 26 and 28, each of which is clocked at its C input by the clock pulses of frequency F from input 16. The $\overline{Q}$ output of flip-flop 26 is connected to the J input of flip-flop 28, and the Q output of flip-flop 28 is connected via return line 30 to the $\overline{J}$ input of flip-flop 26. The $\overline{K}$ input of each flip-flop is tied low.

A NOR gate 32 receives its inputs from the Q outputs of flip-flops 26 and 28. A first AND gate 34 has one input connected to the output of NOR gate 32, and its second input receiving inverted clock pulses from logic means 36 providing inverted and non-inverted outputs. This logic means may be an AND gate 38 with one input tied high and the other input receiving clock pulses of frequency F from input 16. The AND gate 38 has a pair of outputs, one of which is the inversion of the other. If desired, delay means such as another gate 40 may be provided, for example, another AND gate with one of its inputs tied high. AND gate 42 has one input connected to the Q output of flip-flop 28, and receives clock pulses of frequency F at its other input. Gates 34 and 42 have their outputs connected in parallel to a common connection 18 to the clock input of flip-flop 20.

FIG. 2 shows the truth table for a JK flip-flop for the reader's convenience. FIG. 3 illustrates operation of the circuit of FIG. 1, wherein the Q output of flip-flop 26 is designated signal pulse stream $S_1$, the Q output of flip-flop 28 is designated signal pulse stream $S_2$, the output of gate 32 is designated signal pulse stream $S_3$, the combined output of parallel gates 34 and 42 on line 18 is designated signal pulse stream $S_4$, and the Q output of flip-flop 20 on line 24 is designated signal pulse stream $S_5$.

As seen in FIG. 2, the $S_1$ pulses output from flip-flop 26 have a frequency of $\frac{1}{3}$F and are nonsymmetrical with a duty cycle of substantially 33%. Pulses $S_2$ and $S_3$ output from flip-flop 28 and gate 32, respectively, also have a frequency of $\frac{1}{3}$F and a nonsymmetrical duty cycle of 33%. Pulses $S_1$, $S_2$ and $S_3$ are not aligned, but rather are staggered such that the duty portion of $S_2$ immediately follows the duty portion of $S_1$, and the duty portion of $S_3$ immediately follows the duty portion of $S_2$, etc. The pair of gates 34 and 42 gate the clock pulses of frequency F against pulse streams $S_2$ and $S_3$.

Gate 42 outputs a pulse during the first half of the duty portion of a cycle of $S_2$. Gate 34 outputs a pulse during the second half of the duty portion of a cycle of $S_3$. This results in pulses $S_4$ of frequency $\frac{2}{3}$F on line 18 with a duty cycle of substantially 33%. These $\frac{2}{3}$F pulses $S_4$ clock flip-flop 20 to provide symmetrical signal pulse stream $S_5$ of frequency $\frac{1}{3}$F, having a duty cycle of substantially 50%.

Circuit 10 may be used in any system requiring a divide by three circuit. The circuit may be implemented using any integrated circuit family, depending upon the frequency at which the divide operation is required to operate. In one system, a symmetrical output at 24 with a 50%+/−5% duty cycle was desired from a 90 MHz input clock 16. Circuit 10 easily satisfied these requirements. For input speeds over 100 MHz, ECL type integrated circuits are preferred.

It is recognized that various modifications are possible within the scope of the appended claims.

I claim:

1. A divide by three digital clock divider circuit providing a symmetrical output, comprising:

a divide by one and one-half circuit comprising flip-flop means and gate means for receiving clock pulses of frequency F and generating nonsymmetrical pulses of frequency $\frac{1}{3}$F, and for gating said clock pulses with said nonsymmetrical pulses and generating pulses of frequency $\frac{2}{3}$F; and divide by two means receiving said pulses of frequency $\frac{2}{3}$F and outputting symmetrical pulses of frequency $\frac{1}{3}$F.

2. The invention according to claim 1 wherein said divide by two means comprises a divide by two flip-flop clocked by said $\frac{2}{3}$F pulses from said divide by one and one-half circuit, said flip-flop having an opposite polarity output returned to an input to be clocked therethrough by said $\frac{2}{3}$F pulses to provide symmetrical $\frac{1}{3}$F pulses on another output thereof.

3. The invention according to claim 1 wherein said divide by one and one-half circuit generates a plurality of nonaligned staggered signal streams with nonsymmetrical pulses of frequency $\frac{1}{3}$F, and said gate means gates said clock pulses against two of said streams.

4. The invention according to claim 3 wherein:

a first said $\frac{1}{3}$F stream has a duty cycle of substantially 33% and is gated against said clock pulses to yield output pulses during the first half of the duty portion of a cycle of said first $\frac{1}{3}$F stream.

a second said $\frac{1}{3}$F stream has a duty cycle of substantially 33% immediately following the duty portion of said first $\frac{1}{3}$F stream, said second $\frac{1}{3}$F stream being gated against said clock pulses to yield output pulses during the second half of the duty portion of a cycle of said second $\frac{1}{3}$F stream, such that the output of said divide by one and one-half circuit provides pulses of frequency $\frac{2}{3}$F with a duty cycle of substantially 33%.

5. The invention according to claim 4 wherein said divide by one and one-half circuit comprises:

a first flip-flop clocked by said clock pulses;

a second flip-flop clocked by said clock pulses and having an input connected to an output of said first flip-flop;

means connecting an output of said second flip-flop to an input of said first flip-flop;

gate means receiving said clock pulses and receiving outputs of said first and second flip-flops, and including a pair of gates output in parallel to a common connection to said divide by two means, each gate providing alternate pulses in said $\frac{2}{3}$F signal.

6. The invention according to claim 5 wherein said gate means comprises:

a first gate having a first input connected to an output of said first flip-flop, and a second input connected to an output of said second flip-flop;

means providing inverted clock pulses;

a second gate having a first input connected to the output of said first gate, and having a second input receiving inverted clock pulses; and a third gate having a first input connected to an output of said second flip-flop, and having a second input receiving noninverted clock pulses, said second and third gates forming said pair of gates.

7. The invention according to claim 6 wherein:

said first and second flip-flops comprise JK flip-flops, the $\overline{Q}$ output of the first JK flip-flop connected to the J input of the second JK flip-flop, the Q output of said second JK flip-flop connected to the $\overline{J}$ input of said first JK flip-flop;

said first gate comprises a NOR gate input from the Q outputs of said first and second JK flip-flops;

said second and thrid gates comprise AND gates, one of which is input from said Q output of said second JK flip-flop, the other of which is input from the output of said NOR gate.

8. A divide by three digital clock divider circuit providing a symmetrical output, comprising:

a divide by one and one-half circuit comprising flip-flop means and gate means for receiving clock pulses of frequency F and generating a plurality of nonaligned staggered signal streams with nonsymmetrical pulses of frequency $\frac{1}{3}$F including first and second $\frac{1}{3}$F streams each having a duty cycle of substantially 33%, said gate means gating said clock pulses against said first $\frac{1}{3}$F stream to yield output pulses during the first half of the duty portion of a cycle of said first $\frac{1}{3}$F stream, and gating said clock pulses against said second $\frac{1}{3}$F stream to yield output pulses during the second half of the duty portion of a cycle of said second $\frac{1}{3}$F stream, such that the output of said divide by one and one-half circuit provides pulses of frequency $\frac{2}{3}$F with a duty cycle of substantially 33%; and a divide by two flip-flop clocked by said divide by one and one-half circuit to provide symmetrical $\frac{1}{3}$F output pulses.

* * * * *